United States Patent
Vashchenko et al.

(10) Patent No.: US 7,180,133 B1
(45) Date of Patent: Feb. 20, 2007

(54) METHOD AND STRUCTURE FOR ADDRESSING HOT CARRIER DEGRADATION IN HIGH VOLTAGE DEVICES

(75) Inventors: Vladislav Vashchenko, Palo Alto, CA (US); Peter J. Hopper, San Jose, CA (US); Yuri Mirgorodski, Sunnyvale, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 107 days.

(21) Appl. No.: 11/016,147

(22) Filed: Dec. 17, 2004

(51) Int. Cl.
*H01L 29/76* (2006.01)

(52) U.S. Cl. .................................. 257/343; 257/487

(58) Field of Classification Search .............. 257/343, 257/487, 491, 495
See application file for complete search history.

(56) References Cited

U.S. PATENT DOCUMENTS 5,898,201 A * 4/1999 Hsu et al. .................. 257/409

* cited by examiner

*Primary Examiner*—Mark V. Prenty
(74) *Attorney, Agent, or Firm*—Jurgen Vollrath

(57) ABSTRACT

In a method and structure for a high voltage LDMOS with reduced hot carrier degradation, the thick field oxide is eliminated and a reduced surface field achieved instead by including adjacent p+ and n+ regions in the drain well and shorting these regions to each other, or by including a p+ region in the drain well and biasing it to a positive voltage relative to the source voltage.

14 Claims, 2 Drawing Sheets

METHOD AND STRUCTURE FOR ADDRESSING HOT CARRIER DEGRADATION IN HIGH VOLTAGE DEVICES

FIELD OF THE INVENTION

The invention deals CMOS/BiCMOS technologies. In particular it deals with extended voltage range devices.

BACKGROUND OF THE INVENTION

Numerous applications such as portable power supplies, amplifiers, EEPROMs, charge pumps on-chip, etc., need to be operated at higher voltage levels. These extended voltages typically range between 12V and 20V. In order to keep costs down is desirable to be able to use base 5V technology to build these high voltage devices, thereby avoiding having to resort to special high voltage technologies.

One solution that makes use of only existing masks and thereby limits costs is the extended drain device, also sometimes referred to as lateral DMOS (LDMOS), illustrated in FIG. 1. The device 100 includes a source 102 formed in an n-well 104, and a drain 106 formed in an n-well 108. In order to accommodate the higher voltage levels the drain 106 is extended in length as shown in FIG. 1. Due to the high voltage applied to the drain 106 a high voltage junction is formed between the p-well 110 under the gate polysilicon 112, and the n-well 108. As a result, the gate polysilicon requires a thick field oxide 120, e.g., a shallow trench isolation region or LOCOS region to provide a reduced surface field (RESURF). Furthermore, the high junction voltage together with the large size of the drain 106 results in a large depletion region in the n-well 108 under the field oxide 120. This depletion region is a critical part of the device since the electric field distribution in this region determines not only the breakdown voltage but also impacts the hot carrier degradation (HCD) of the device. The field oxide traps injected charge carriers, thus resulting in HCD. Thus the design of the extended drain part becomes a complex issue to avoid irregularities and achieve the desired voltage breakdown and drain-source resistance parameters.

SUMMARY OF THE INVENTION

The present invention seeks to provide an alternative low cost high voltage solution that avoids the need for a thick field oxide. In order to provide a device without a thick field oxide that requires no additional masks, the present invention creates a reduced surface field (RESURF) by introducing a new p+ region into the n-well of the drain and either applying a voltage to the new p+ region or also adding a new n+ region and shorting the new p+ region and new n+ region, e.g., by means of an interconnect.

Thus, according to the invention there is provided a high voltage device that includes a source formed in a first n-well, a drain formed in a second n-well, the first and second n-wells being formed in a p-well and spaced from each other, a gate polysilicon formed on top of the p-well, and a p-doped region formed in the second n-well, the p-doped region being biased to a predefined voltage or shorted to a n-doped region formed in the second n-well in abutment with the p-doped region. If the p-doped region is biased to a predefined voltage the n-doped region may be eliminated. Typically the p-doped region, if biased, is biased to a voltage higher than the voltage applied to the source. If the n-doped region is provided, the p-doped region may be shorted to the n-doped region by an interconnect spanning the p-doped and n-doped regions, and the interconnect may be a floating interconnect, and may be isolated from the gate polysilicon by an oxide layer. The p-doped region may be a p+ diffusion, and the n-doped region may be an n+diffusion.

Further, according to the invention, there is provided a method of reducing the hot carrier degradation in a high voltage transistor that includes a source formed in a first n-well, a drain formed in a second n-well, and a gate, comprising forming a p-doped region in the second n-well and biasing the n-well or forming an n-doped region next to the p-doped region and shorting the n-doped region to the p-doped region.

The biasing may include connecting the p-doped region to the source through a resistor. The shorting of the p-doped region and the n-doped region may include forming an interconnect that spans over the p-doped and the n-doped regions and which may be a floating interconnect. The p-doped region may be formed as a p+ diffusion, and the n-doped region may be formed as an n+diffusion.

DETAILED DESCRIPTION OF THE INVENTION

Figure 1:
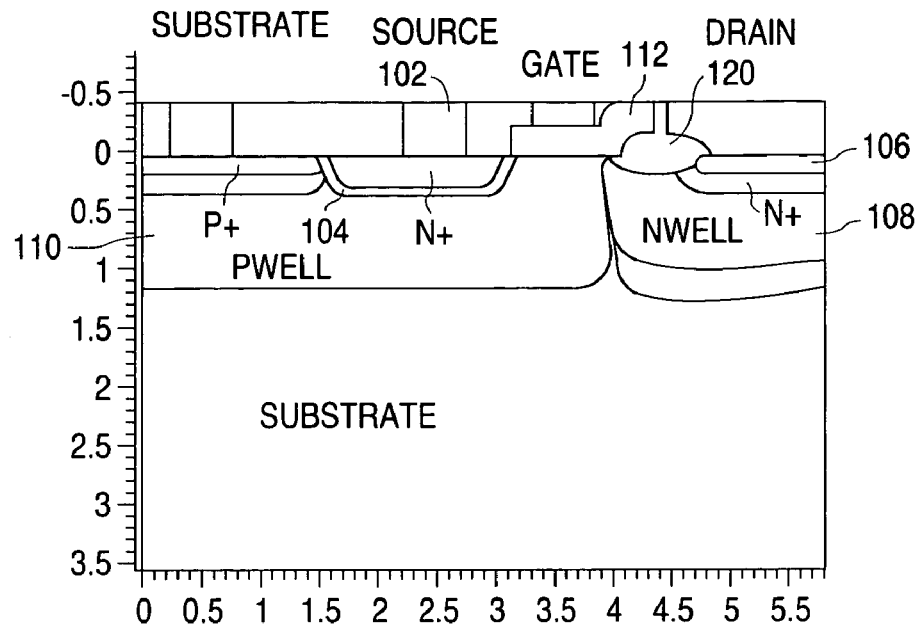
FIG. 1 is a sectional view through an extended drain device as known in the art.
Figure 2:
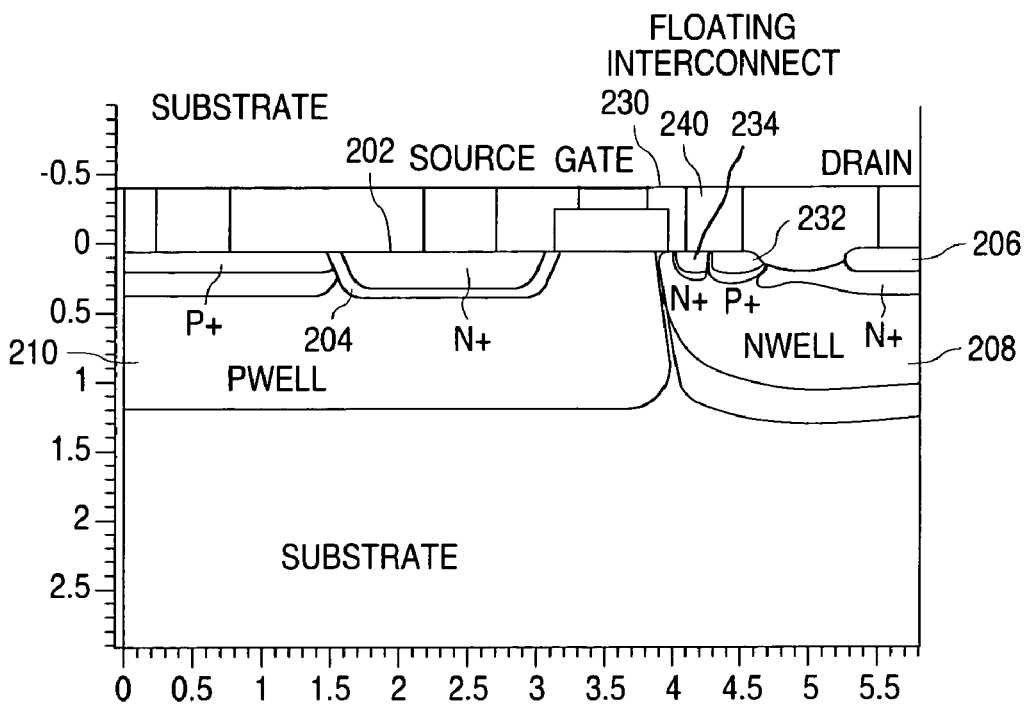
FIG. 2 is a sectional view through one embodiment of a device of the invention.

FIG. 2 shows one embodiment of the invention. As in the prior art LDMOS device of FIG. 1, the present embodiment of an LDMOS 200 has a source 202 formed in an n-well 204, and a drain 206 formed in an n-well 208. However, in accordance with the invention the thick field oxide 120 of the prior art, which reduces the surface field alongside the gate polysilicon, has been eliminated. This alleviates hot carrier degradation (HCD) since it eliminates a region that traps injected charge carriers. In order to create a reduced surface field (RESURF) in spite of the elimination of the thick field oxide the present embodiment introduces a p-doped region in the form of a p+ region 232 and a n-doped region in the form of a n+ region 234, alongside each other in the n-well 208. The p+ region 232 and n+ region 234 in this embodiment are shorted to each other by a floating interconnect 240, and the interconnect 240 is isolated from the polysilicon gate 212 by an oxide layer 230. Since the present device is intended for high voltage applications (commonly between 12 and 24 V) the p-n junction between the n-well 208 and p-well 210 would, in the absence of the new p+ region 232 and n+ region 234, provide a high voltage junction with a high surface electric field adjacent the gate polysilicon, producing a large depletion region. By introducing the diode-like structure defined by the p+ region 232 and n+ region 234 the surface electric field is reduced causing the depletion region in the n-well to be reduced in size. Thus the p+ region 232 and n+ region 234 provide for RESURF, thereby providing a high voltage structure that allows the thick field oxide to be eliminated thereby reducing HCD.

Figure 3:
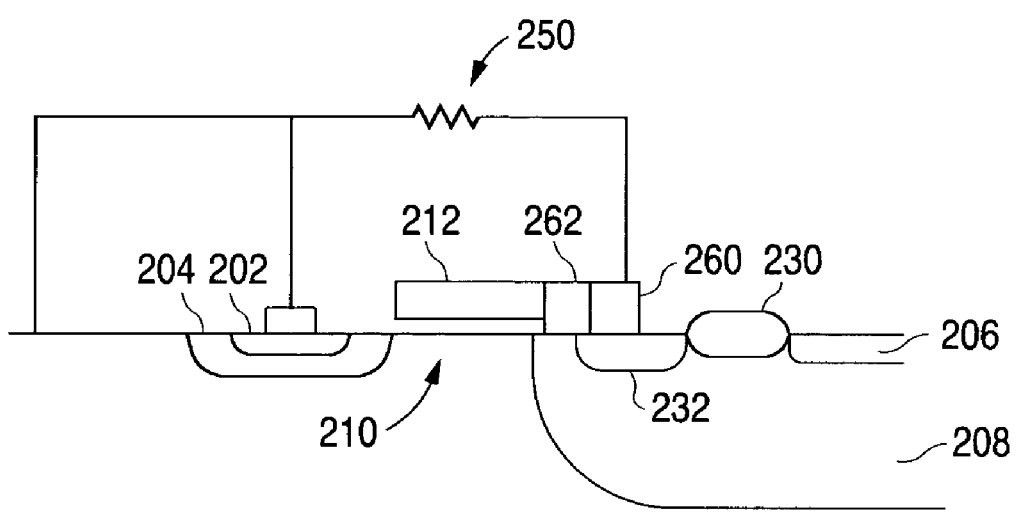
FIG. 3 is a sectional view through another embodiment of a device of the invention.

Another embodiment of the invention is shown in FIG. 3. For ease of reference similar elements to those in the FIG. 2 embodiment, are indicated by the same reference numerals as in the FIG. 3 embodiment. In this embodiment the n+ region 234 of the previous embodiment is not formed in the n-well 208. Instead there is only a p+ region 232. In order to ensure that the p+ region 232 reduces the surface field and causes a reduction in the depletion layer in the n-well 208, the p+ region is biased to a predefined voltage that is higher than the source voltage by connecting the p+ region to the source 202 via a resistor 250. This provides the p+ region with a positive bias causing the depletion layer to be pushed back and reducing the surface field. The contact 260 to the p+ region 232 is isolated from the polysilicon gate 212 by an oxide layer 262.

The present invention results in increased on-state resistance, causing reduced on-state current. However, this can be alleviated by means of the n+ region 234 in the FIG. 2 embodiment, which improves the on-state characteristics by reducing the on-state resistance. Thus, yet another embodiment would be to include a n+ region in the n-well 208 of FIG. 3, in order to increase the on-state resistance. Such an n+ region in the n-well 208 need not abut the p+ region and can either be shorted to the p+ region or remain floating.

The present invention provides the potential for advanced deep submicron technologies by providing greater efficiency in the case of smaller feature dimensions achievable with further process scaling.

What is claimed is:

1. A high voltage device, comprising
a source formed in a first n-well,
a drain formed in a second n-well, the first and second n-wells being formed in a p-well and spaced from each other,
a gate polysilicon formed on top of the p-well, and
a p-doped region and an n-doped region in abutment with the p-doped region formed in the second n-well, the p-doped region being biased to a predefined voltage or shorted to the n-doped region.

2. A high voltage device of claim 1, wherein the p-doped region is biased to a voltage higher than the voltage applied to the source.

3. A high voltage device of claim 1, wherein the p-doped region is shorted to the n-doped region by an interconnect spanning the p-doped and n-doped regions.

4. A high voltage device of claim 3, wherein the interconnect is a floating interconnect.

5. A high voltage device of claim 3, wherein the interconnect is isolated from the gate polysilicon by an oxide layer.

6. A high voltage device of claim 1, wherein the p-doped region includes a contact for biasing the p-doped region, the contact being isolated from the gate polysilicon by an oxide layer.

7. A high voltage device of claim 1, wherein the p-doped region is a p+ diffusion, and the n-doped region is an n+diffusion.

8. A method of reducing the hot carrier degradation in a high voltage transistor that includes a source formed in a first n-well, a drain formed in a second n-well, and a gate, comprising
forming a p-doped region in the second n-well and
forming an n-doped region next to the p-doped region in the second n-well and shorting the n-doped region to the p-doped region.

9. A method of reducing the hot carrier degradation in a high voltage transistor that includes a source formed in a first n-well, a drain formed in a second n-well, and a gate, comprising
forming a p-doped region in the second n-well and
biasing the p-doped region, wherein the biasing includes connecting the p-doped region to the source through a resistor.

10. A method of claim 9, wherein an n+ region is formed in the second n-well.

11. A method of claim 9, further comprising providing the p-doped region with a contact and isolating the contact from the gate by means of an oxide layer.

12. A method of claim 8, wherein the shorting of the p-doped region and the n-doped region includes forming an interconnect that spans over the p-doped and the n-doped regions.

13. A method of claim 12, wherein the interconnect is left as a floating interconnect.

14. A method of claim 8, wherein the p-doped region is formed as a p+ diffusion, and the n-doped region is formed as an n+diffusion.

* * * * *